(12) United States Patent
Arita et al.

(10) Patent No.: US 6,340,639 B1
(45) Date of Patent: Jan. 22, 2002

(54) PLASMA PROCESS APPARATUS AND PLASMA PROCESS METHOD FOR SUBSTRATE

(75) Inventors: Kiyoshi Arita; Tetsuhiro Iwai; Hiroshi Haji, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/694,669

(22) Filed: Oct. 24, 2000

(30) Foreign Application Priority Data

Oct. 26, 1999 (JP) .............................. 11-303655

(51) Int. Cl.[7] ...................... H01L 21/302; H01L 21/461
(52) U.S. Cl. ...................................................... 438/729
(58) Field of Search .................................. 438/729, 730

(56) References Cited

U.S. PATENT DOCUMENTS 5,556,500 A * 9/1996 Hasegawa et al. .......... 156/345

FOREIGN PATENT DOCUMENTS

JP          7-211703          8/1995

* cited by examiner

Primary Examiner—David Nelms
Assistant Examiner—Thah Thao P. Le
(74) Attorney, Agent, or Firm—McDermott, Will & Emery

(57) ABSTRACT

A plasma process apparatus performing an even plasma processing over the entire surface of a substrate, without accompanying thermal damage, and method of the plasma processing. In a process room 2, where a semiconductor wafer 4 is placed on a lower electrode 3 for processing with plasma, the semiconductor wafer 4 which has been fixed on a resin sheet 4a whose thermal expansion coefficient is greater than that of the semiconductor wafer 4 is pressed at the circumference edge by a substrate holding device 5 onto the surface of lower electrode 3. In such a setup, central portion of the semiconductor wafer can also be pressed onto the lower electrode 3 via the resin sheet 4a. Thus, there will be no gap between the surface of lower electrode 3 and the substrate, which contributes to eliminate thermal damages due to abnormally high temperature and to avoid a local discharge.

18 Claims, 3 Drawing Sheets

(a)

(b)

PLASMA PROCESS APPARATUS AND PLASMA PROCESS METHOD FOR SUBSTRATE

FIELD OF THE INVENTION

The present invention relates to a plasma process apparatus for processing a semiconductor wafer or such other substrates with plasma, and the processing method.

BACKGROUND OF THE INVENTION

The plasma process apparatus is a facility formed of a hermetically sealed space in which electrodes are provided. An object of processing, such as a substrate for semiconductor devices, is placed on the electrode, and a plasma discharge is provided in an atmosphere of reduced pressure for cleaning or etching the substrate, or depositing a certain specific layer on the substrate. The plasma discharge accompanies a heat generation; as a result, temperature of a substrate increases in the course of plasma processing. In an extreme case when the temperature rose to an extremely high level, the substrate could be burnt or broken due to thermal damage. In order to prevent this to happen, plasma process apparatus is normally provided with a cooling system intended to prevent a substrate from going too high temperature by cooling the electrode.

However, in a case where the object of plasma processing is a thin substrate whose thickness is very small relative to the area space, the substrate may easily cause a bowing when the temperature goes high. Then, part of the substrate lifts off the surface of electrode during plasma processing, which generates a gap between substrate and electrode. Once such a gap is generated, heat transmission from the substrate to the electrode is blocked, or the cooling effects can not reach the substrate despite the electrode is being cooled. Under such a situation, temperature of the substrate continues to go up and the substrate will suffer from thermal damage. Furthermore, abnormal discharge generated across the gap affects the evenness of plasma treatment.

Proving a mechanical pressure on substrate at the circumference edge has been one of the commonly employed countermeasures for preventing the bowing. For example, Japanese patent laid-open No. 211703/1995 (conventional technology) discloses a method, in which a silicon wafer 1 placed on a specimen electrode 3 is mechanically pressed down at the edge by a specimen holding device 4. Such a method, however, does not work well to suppress the lifting of silicon wafer at the central portion. Providing an electrostatic sucking device (electrostatic chuck) on the electrode could be a solution. However, cost of such device is rather high, which in turn invites a high production cost.

SUMMARY OF THE INVENTION

The present invention aims to offer a plasma process apparatus, as well as a method for the plasma process, with which a substrate can be cooled effectively during plasma processing, thermal damage is avoided, and an even treatment by plasma is provided.

With a plasma process apparatus of the present invention, a substrate is provided integrally on the bottom surface with a support member whose thermal expansion coefficient is greater than that of the substrate, which plasma process apparatus comprises substrate holding means for making contact with and pressing at the circumference edge the substrate, which is placed on an electrode with the support member down, onto the electrode from above, and cooling means for cooling the electrode.

In practice, a resin sheet is used for the above-described support member, and a semiconductor wafer is used for the substrate.

A plasma process apparatus of the present invention features in that it handles a substrate that is a semiconductor substrate bearing a circuit pattern formed on the front surface and a support member is attached on the front surface of the semiconductor substrate. The semiconductor substrate is placed on an electrode to be undergoing a plasma processing at the reverse surface.

In the present plasma process apparatus, the substrate holding means presses a substrate onto the electrode with a force that allows the substrate and the support member to make thermal expansion/shrinkage.

In a plasma process method of the present invention, a substrate is provided integrally at the bottom surface with a support member whose thermal expansion coefficient is greater than that of the substrate. The plasma process method comprises the steps of placing the substrate on the upper surface of an electrode with the support member down, pressing the substrate at the circumference edge onto the electrode, and generating plasma in a process chamber by applying a high frequency voltage to the electrode, while it is being cooled.

Practically, a resin sheet is used for the above-described support member attached on the bottom surface of the substrate, and a semiconductor wafer is used for the substrate.

In a plasma process method of the present invention, the substrate is a semiconductor substrate bearing a circuit pattern formed on the front surface and the support member is attached on the front surface of the semiconductor substrate. The semiconductor substrate is placed on the electrode to be processed with plasma at the reverse surface.

In the present plasma process method, the substrate is pressed at the circumference edge with a force that allows the substrate and the support member to make thermal expansion/shrinkage.

Method of the present invention is suitable especially to manufacturing of semiconductor devices. Based on the present method, thinner semiconductor devices may be implemented.

Under the above-described setup, where a substrate is fixed at the bottom surface with a support member and the substrate is processed by plasma while it is being pressed by substrate holding means, which is making contact at the circumference edge, onto the electrode, a force caused by thermal deformation of the substrate having the support member is converted into a force that exerts to have the substrate adhere closer to the electrode surface. Thus the simple method is effective in preventing the lifting up of a substrate due to thermal deformation.

BRIEF DESCRIPTION OF THE DRAWINGS

FIG. 2(*b*) is a perspective view of a part of the plasma process apparatus for processing a substrate in accordance with an exemplary embodiment of the present invention.

DESCRIPTION OF THE PREFERRED EMBODIMENT (Embodiment)

Figure 1:
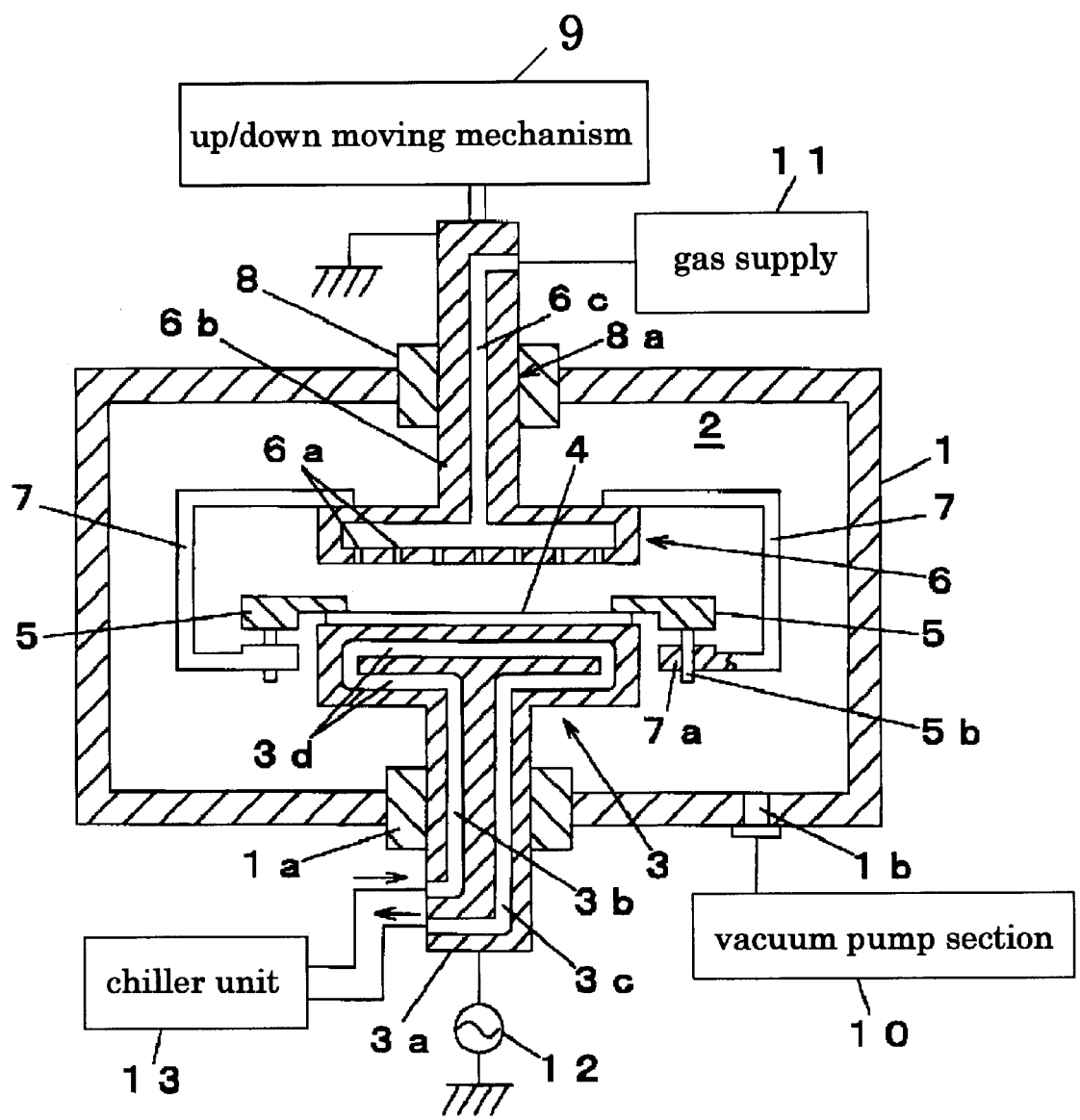
FIG. 1 is a cross sectional view showing the whole aspect of a plasma process apparatus for processing a substrate in accordance with an exemplary embodiment of the present invention.
Figure 2:
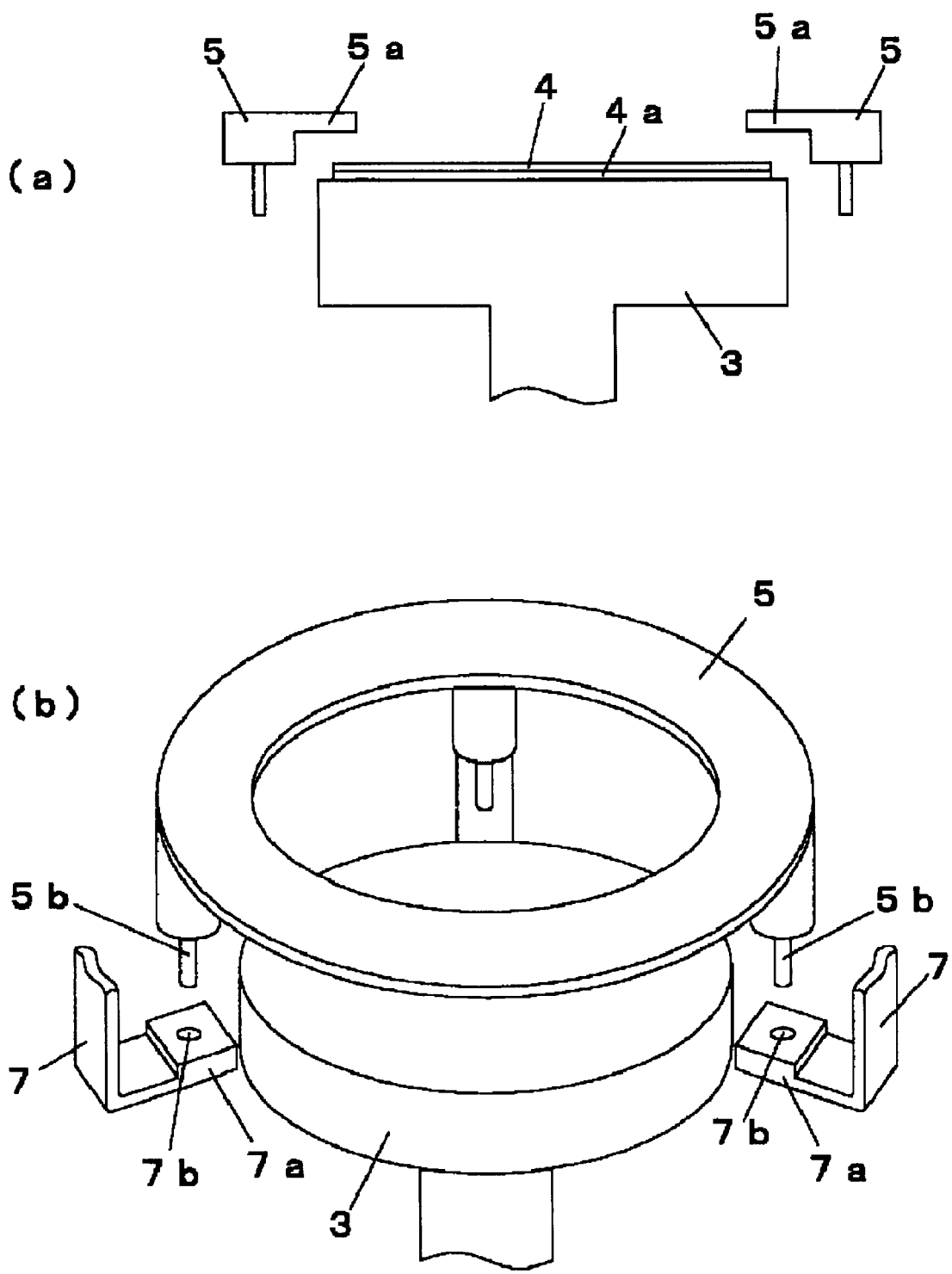
FIG. 2(*a*) is a cross sectional view in part of a plasma process apparatus for processing a substrate in accordance with an exemplary embodiment of the present invention.
Figure 3:
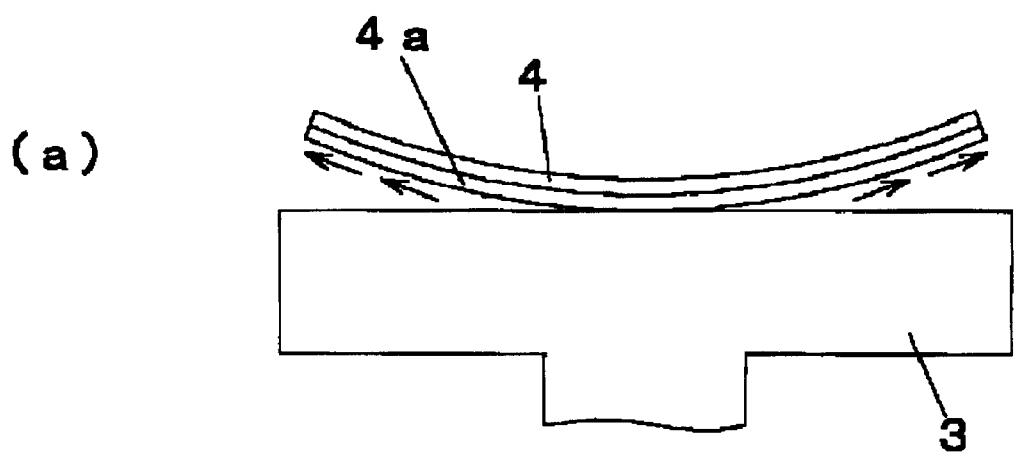
FIGS. 3A and 3B is are drawings used to illustrate thermal deformation of a substrate in an exemplary embodiment of the present invention.
Figure 3:
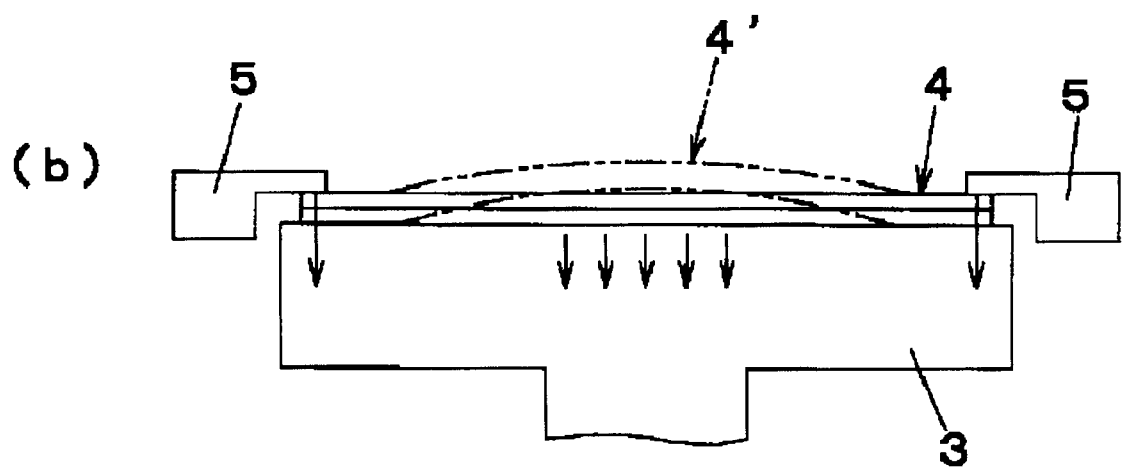

FIG. 1 is a cross sectional view showing the whole aspect of a plasma process apparatus for processing a substrate in accordance with an exemplary embodiment of the present invention, FIG. 2(a) is a cross sectional view in part of the plasma process apparatus, FIG. 2(b) is a perspective view of a part of the plasma process apparatus, FIG. 3 is drawings used to describe thermal deformation of a substrate.

The structure of plasma process apparatus is described referring to FIG. 1. A plasma process apparatus in the present embodiment is an etching apparatus for etching the back surface of a wafer for thinning. In FIG. 1, a vacuum chamber 1 is a hermetic container, inside of which forms a process room 2 for plasma processing. Inside the process room 2, a disk-shape lower electrode 3 is provided, the lower electrode 3 having a column part 3a at the bottom which goes through an insulating body 1a provided in an insulating through hole formed at a part of the bottom of the vacuum chamber 1. An air exhaust hole 1b is provided at a bottom part of the vacuum chamber 1, which exhaust hole is coupled with a vacuum pump section 10. The air in the process room 2 is removed to a vacuum as the result of operation of the vacuum pump section 10.

Top surface of the lower electrode 3 forms a platform for placing thereon an object of plasma processing, or a semiconductor wafer (hereinafter referred to simply as "wafer") 4. As shown in FIG. 2(a), the wafer 4, which is made mainly of silicon, is provided with a resin sheet 4a glued with an adhesive on the bottom surface to cover the whole area. The resin sheet 4 has a thermal expansion coefficient $\alpha 1$ that is greater than that of silicon ($\alpha 2 = 3 \times 10^{-6}$), which is the material forming the wafer 4. Material of the resin sheet 4a used in the present example is polyolefin, whose thermal expansion coefficient is $\alpha 1 = 100 \times 10^{-6}$. Namely, the wafer 4 is provided integrally with a support member made of polyolefin, or resin sheet 4a, whose thermal expansion coefficient is greater than that of silicon. The resin sheet 4a has a heat-resistive property, which is attached to the wafer 4 on the circuit-formed surface.

An upper electrode 6 is provided opposing to the upper surface of the lower electrode 3, as shown in FIG. 1. There is a sealing bearing 8 in a part of the upper portion of the vacuum chamber 1, a sliding portion 6b of the upper electrode 6 is coupled with a through hole 8a of the sealing bearing 8 so that the sliding portion can move up and down, yet the vacuum chamber is hermetically sealed. The upper electrode 6 is engaged with an up/down moving mechanism 9, which drives the upper electrode 6 up and down in the process room 2.

When the upper electrode 6 is at the bottom position, there is a clearance between the bottom surface of the upper electrode 6 and the lower electrode 3, which clearance being an electrode gap suitable to plasma processing; when the upper electrode 6 is at an elevated position, there is a space made available on the upper surface of the lower electrode 3 for placing a wafer 4 on the platform. Although not shown in the drawing, a door is provided in the vacuum chamber 1 for allowing incoming and outgoing of the wafer 4.

The upper electrode 6 has an inner gas duct 6c, which is coupled with a number of gas nozzles 6a provided in the bottom facing the lower electrode 3. The gas duct 6c is connected with a gas supply 11, which delivers oxygen gas, fluorine gas or other gases needed for generating plasma to be injected through the gas nozzles 6a over the wafer 4, which has been disposed on the lower electrode 3 inside the process room 2.

As shown in FIG. 2, a ring-shape substrate holding device 5 is provided above the lower electrode 3. The inner circumference edge 5a of the substrate holding device 5 is locating just above the edge of wafer 4. When the substrate holding device 5 is brought down so that it makes contact at the inner circumference edge 5a to the upper surface of wafer 4, the substrate holding device 5 presses with the self weight the wafer 4 onto the upper surface of the lower electrode 3. Strength of the force the substrate holding device 5 presses the substrate 4 is such that it allows the substrate 4 and the resin sheet 4a to make thermal expansion/shrinkage. By so doing, concentration of the stress due to thermal expansion to the central part of a wafer can be avoided.

As illustrated in FIG. 1, the upper electrode 6 is provided with a plurality of arms 7 hanging down after stretching somewhat towards radiating directions, the end part 7a of the arm 7 is coming beneath the substrate holding device 5. The substrate holding device 5 is provided with a pin 5b projecting downward, while the end part 7a of the arm 7 is provided with a hole 7b disposed at a place corresponding to the pin 5b. The substrate holding device 5 is supported by the end part 7a, with the pin 5a loosely inserted in the hole 7b. The arms 7 are the members that hold the substrate holding device 5 by the upper electrode 6.

When the upper electrode 6 is elevated, the arms 7 are also elevated, as the result the substrate holding device 5 goes up. On the other hand, when the upper electrode 6 is lowered, the substrate holding device 5 accompanies to make a touch down on the circumference edge of the upper surface of the wafer 4 placed on the lower electrode 3, and the bottom surface of the substrate holding device 5 is released from the upper surface of the end part 7a of the arm 7. In this state, the substrate holding device 5 presses the wafer 4 onto the lower electrode 3 with the self weight.

Namely, in a state where the upper electrode 6 is at the bottom position, the substrate holding device 5 presses the wafer 4 onto the lower electrode 3; while the upper electrode 6 elevated, the wafer 4 is released from the pressing force. The up/down motion of the substrate holding device 5 is conducted by the above-described up/down moving mechanism 9. Namely, the up/down moving mechanism 9 represents means for moving the substrate holding device 5 in relation to the lower electrode 3. In another concept, the lower electrode 3 may be moved up/down for attaining the same objective.

Inside the lower electrode 3, there are inner channels 3b, 3c, which are connected through with a water jacket 3d formed in the upper part of the lower electrode 3. The inner channels 3b, 3c are connected with a chiller unit 13, which circulates cooling water through the water jacket 3d for cooling the lower electrode 3. Namely, the chiller unit 13 and the water jacket 3d represent cooling means for cooling the lower electrode 3. The lower electrode 3 is connected with a high frequency power supply 12, which provides a high frequency voltage between the grounded upper electrode 6 and the lower electrode 3.

Now in the following, operation of the above-configured plasma process apparatus is described. In the first place, the door (not shown) of vacuum chamber 1 is made to open and a wafer 4 fixed with a resin sheet 4a at the bottom surface is placed on the upper surface of the lower electrode 3. The door is closed to make the process room 2 hermetically closed, and the upper electrode 6 is lowered. As a result, a clearance is formed between the bottom surface of the upper electrode 6 and the upper surface of the lower electrode 3, which clearance being a certain specific discharge distance;

at the same time, the substrate holding device 5 comes down to make contact with the upper circumference edge of wafer 4. Thus the resin sheet 4a provided on the bottom surface of the wafer 4 is made to have a contact with the upper surface of the lower electrode 3.

The vacuum pump section 10 is put into the operation to evacuate the air inside of the process room 2. After it reached a certain specified degree of vacuum, the gas supply 11 is put into operation to have plasma generation gas injected through the gas nozzles 6a. In this stage, the high frequency power supply 12 is put into operation to deliver a high frequency voltage between the upper electrode 6 and the lower electrode 3. By so doing, a plasma discharge is generated between the upper electrode 6 and the lower electrode 3, and the surface of wafer 4 is processed by the plasma thus generated.

As the plasma processing proceeds, temperature of the wafer 4 and the resin sheet 4b goes high. The chiller unit 13 circulates cooling water through the water jacket 3d provided in the lower electrode 3 for cooling the lower electrode 3. The high temperature generated in the wafer 4 as a result of plasma processing is transmitted to the lower electrode 3, and the wafer 4 is prevented from going too high a temperature.

Next, the behavior during plasma processing of wafer 4 provided integrally with the resin sheet 4a at the bottom surface is described with reference to FIG. 3. FIG. 3(a) shows a deformed state of the wafer 4 at an increased temperature, with no restriction posed by a substrate holding device.

Since the wafer 4 has been fixed and glued on a resin sheet 4a having a thermal expansion coefficient higher than that of the wafer 4, a greater thermal expansion is generated with the resin sheet 4a than in the wafer 4; as the result, it exhibits a bowing (concave shape in the up direction, convex shape in the down direction), as illustrated in FIG. 3(a), when there is no restriction by substrate holding means. Namely, a wafer 4 in the present embodiment, which has been fixed at the bottom surface with a resin sheet 4a, exhibits such thermal deformation where the wafer lifts off the lower electrode 3 at the circumference edge. Such bowing deformation is significant with the wafers 4 of smaller thickness.

FIG. 3(b) shows a state of the above-described wafer 4 being processed in a plasma process apparatus in accordance with the present embodiment. In this state, the wafer 4 is pressed at the circumference edge portion by the substrate holding device 5 onto the lower electrode 3 with a force that allows expansion/shrinkage due to thermal expansion. Therefore, even when the temperature goes high during plasma processing to a thermal deformation, the wafer 4 remains in a state being pressed at the circumference edge, and there is no such a concave deformation as illustrated in FIG. 3(a).

Under the present status where the warping of a substrate due to difference in thermal expansion coefficient between the resin sheet 4a and the wafer 4 is being amended by force, it generates a force in the inside that presses the central portion of the wafer towards the upper surface of the lower electrode 3 via the resin sheet 4a, in addition to the force that prevents the wafer 4 from making lifting up at the circumference. As the result, an even contact of the wafer 4 over the entire surface to the upper surface of the lower electrode 3 is maintained via the resin sheet 4a.

The lift-up phenomenon at the central area of a substrate, which is observed when a normal substrate of small thickness is placed on an electrode and pressed at the circumference (illustrated with broken lines 4' in FIG. 3(b)), is not observed here in the present invention. Therefore, no gap exists between the wafer 4 and the upper surface of lower electrode 3, the heat generated with the wafer 4 as a result of plasma processing is efficiently transmitted to the cooled lower electrode 3, and temperature of the wafer 4 does not go up to an abnormal level. Furthermore, in the present invention, the unevenness of plasma processing, which occurs as a result of local discharge across the gap, will not arise.

In the above-described embodiment 1, a thin substrate like the wafer 4 is fixed at the bottom surface with a support member, the material of which having a thermal expansion coefficient greater than that of the thin substrate, and the thin substrate undergoes plasma processing while it is pressed at the circumference onto electrode. Thermal deformation caused on a thin substrate of the present invention by the heat generated during plasma processing makes the thin substrate to behave so that it is pressed entirely onto the surface of electrode, and the gap generation between the thin substrate and the electrode is prevented.

As described in the above, in the present invention a substrate is fixed with a support member made of a material having a thermal expansion coefficient greater than that of the substrate, and it is processed with plasma while it is being pressed from the above, at the circumference of the substrate or at the circumference of the support member, by a substrate holding device onto the electrode for making sure of the contact with electrode. As the result, a thermal deformation, if there is, caused on the substrate by a high temperature is converted into a force that makes the substrate to behave so that it is pressed even onto the electrode, and the gap generation between the substrate and the electrode is prevented. In this way, possible damages to be incurred on a substrate by an abnormally high temperature may be prevented, and an even treatment with plasma of a substrate may be insured in accordance with the present invention.

What is claimed is:

1. A plasma process method for processing a substrate disposed on an electrode provided in a hermetically sealed processing chamber, comprising the steps of:

providing a support member integrally on the bottom surface of the substrate, said support member having a thermal expansion coefficient greater than that of the substrate, placing said substrate on an upper surface of the electrode such that said support member contacts said upper surface of said electrode, pressing the substrate onto the electrode by making contact from above with the substrate at the circumference edge, generating plasma in a processing chamber by applying a high frequency voltage on the electrode, and cooling said electrode.

2. The plasma process method of claim 1, wherein the support member is a resin sheet attached on a bottom surface of the substrate.

3. The plasma process method of claim 1, wherein the substrate is a semiconductor wafer.

4. The plasma process method of claim 1, wherein the substrate is a semiconductor substrate having a circuit pattern on a front surface, and the semiconductor substrate is provided with a support member on the front surface to be placed on the electrode, said semiconductor substrate undergoing plasma processing on a reverse surface.

5. The plasma process method of claim 1, wherein the substrate is pressed at the circumference edge onto the electrode with a force that allows the substrate and the support member to perform thermal expansion/shrinkage.

6. A semiconductor device processed by the plasma process method recited in claim 1.

7. A semiconductor device processed by the plasma process method recited in claim 2.

8. A semiconductor device processed by the plasma process method recited in claim 3.

9. A semiconductor device processed by the plasma process method recited in claim 4.

10. A semiconductor device processed by the plasma process method recited in claim 5.

11. The plasma process method of claim 2, wherein said support member is glued to said bottom surface of the substrate.

12. A method for performing plasma processing within a sealed processing chamber having an electrode disposed therein for receiving a substrate to be processed, said method comprising the steps of:

providing a support member affixed to a bottom surface of said substrate, said support member having a thermal expansion coefficient greater than that of the substrate, placing said substrate on said electrode such that said support member contacts and upper surface of said electrode, positioning a holding device on said substrate, said holding device exerting a downward pressure on said substrate, and providing a cooling device for cooling said electrode when a plasma is generated in said processing chamber.

13. The method for performing plasma processing according to claim 12, wherein said support member comprises a resin sheet.

14. The method for performing plasma processing according to claim 13, wherein said holding device comprises a ring-shaped member which contacts said substrate along an outer circumference of said substrate.

15. The method of claim 12, wherein said holding device exerts a force on said substrate which allows said substrate and said support member to perform thermal expansion.

16. The method of claim 12, wherein said substrate does not exhibit warping during said plasma processing.

17. The method of claim 12, wherein said downward pressure exerted by said holding device is generated by the weight of said holding device.

18. The method of claim 12, wherein said processing chamber comprises a second electrode which is movable relative to said electrode, said method further comprising the step of lowering said second electrode to an operational position, said holding device being positioned on said substrate when said second electrode is in said operational position, and said holding device being removed from said substrate when said second electrode is in a raised position.

* * * * *